US006799133B2

(12) United States Patent
McIntosh et al.

(10) Patent No.: US 6,799,133 B2
(45) Date of Patent: Sep. 28, 2004

(54) TEST MODE CONTROL CIRCUIT FOR RECONFIGURING A DEVICE PIN OF AN INTEGRATED CIRCUIT CHIP

(75) Inventors: Colin S. McIntosh, The Mount (GB); Colin C. Price, Newbury (GB)

(73) Assignee: Analog Devices, Inc., Norwood, MA (US)

( * ) Notice: Subject to any disclaimer, the term of this patent is extended or adjusted under 35 U.S.C. 154(b) by 6 days.

(21) Appl. No.: 10/253,157

(22) Filed: Sep. 24, 2002

(65) Prior Publication Data

US 2004/0059537 A1 Mar. 25, 2004

(51) Int. Cl.[7] .............................................. G01R 27/28
(52) U.S. Cl. ........................... 702/120; 438/6; 324/765
(58) Field of Search .......................... 702/120, 27, 31, 702/35, 57, 58, 59, 107, 117, 118, 121, 182, 183, 184, 185; 438/5, 6, 17, 21, 106, 460, 478; 324/500, 512, 765

(56) References Cited

U.S. PATENT DOCUMENTS

| 4,504,783 | A | * | 3/1985 | Zasio et al. .................. 324/754 |
| 4,517,661 | A | * | 5/1985 | Graf et al. ..................... 714/25 |
| 5,323,105 | A | * | 6/1994 | Davis et al. ................. 324/761 |
| 5,617,366 | A |   | 4/1997 | Yoo |
| 5,982,188 | A |   | 11/1999 | Lysinger |
| 6,255,835 | B1 |   | 7/2001 | Oh et al. |
| 6,324,666 | B1 | * | 11/2001 | Nakamoto .................. 714/736 |

* cited by examiner

Primary Examiner—Marc S. Hoff
Assistant Examiner—Edward Raymond
(74) Attorney, Agent, or Firm—Iandiorio & Teska

(57) ABSTRACT

A test mode control circuit for reconfiguring a device pin of an integrated circuit chip which is initially configured in a test mode includes an input register for applying trim/configuring data to one or more components on an integrated circuit chip; a device pin; an output register for receiving output data from an integrated circuit on an integrated circuit chip which integrated circuit has had one or more of its elements trimmed/reconfigured; an I/O logic circuit for controlling the device pin to operate as a test pin to selectively deliver the trim/configuring data to the input register and receive output data form the output register; a programmable ray including a plurality of logic state elements for permanently mapping a selected set of the trim/configuring data from the input register, the programmable array including a test bit; and a switching system for applying the trim/configuring data to the one or more components on the integrated circuit when the test bit is in a first, test mode and for applying the permanently mapped trim/configuring data to the components in a second, normal mode.

8 Claims, 2 Drawing Sheets

US 6,799,133 B2

TEST MODE CONTROL CIRCUIT FOR RECONFIGURING A DEVICE PIN OF AN INTEGRATED CIRCUIT CHIP

FIELD OF THE INVENTION

This invention relates to a test mode control circuit for reconfiguring a device pin of an integrated circuit chip to function as a test pin in a test mode and then revert to its device pin function in normal mode.

BACKGROUND OF THE INVENTION

Today, high resolution analog to digital converters (ADCs) are being assembled in smaller geometry, low pin count packages. Small outline packages, with as few as six pins, are good examples. This low pin count poses particular design issues for high resolution ADCs as there just are not enough pins to provide the functionality required. Traditionally ADCs have an analog input pin, dedicated reference inputs, separate power supplies—for both analog and digital circuitry—and a data interface.

All of this functionality has been merged into six pins. One pin is needed for the analog input, two pins are needed for the power supplies/references, and three pins are needed by the digital interface to allow standard connectivity to microprocessors and digital signal processors (DSPs). High resolution ADCs generally require some form on in-package trimming to achieve the precise component accuracy required and this requires data to be written to the part during a test mode.

AVDD positive power supply and reference
AGND negative power supply and reference
AIN analog inputsignal to be digitized
SCLK data interface: serial clock input
CSB data interface: framing signal and sample/convert input
DOUT data interface: output data With this standard digital interface pin assignment it is not possible to write data to the integrated circuit. AIN is a very sensitive analog input so it is unwise to multiplex the test data through this pin. SCLK is the serial clock that controls the analog-to-digital conversion. CSB is a chip select signal. Because of the reduced number of pins this input already doubles up as the convert start (sample) signal and frame synchronization signal for the output data. DOUT is a dedicated output pin. It outputs conversion data when CSB is logic low and is high-impedance when CSB is logic high. The high impedance state is used when many ADCs are linked together to use a common clock and wire-ored data output.

Small form-factor, hand-held, battery powered equipment is pushing package technology to smaller geometries and lower pin counts. More products will have to sacrifice dedicated test mode pins in order to meet this challenge. Another feature that is becoming more common in new product design is the ability to design a general purpose circuit that can be programmed, after wafer fabrication, into a family of derivative parts. Traditionally this was achieved by a separate development and/or metal masks. As process technology shrinks and wafer sizes increase the number of good die from a wafer lot can exceed the lifetime sales of a particular metal mask derivative. Products such as ADCs, switches, and muxes do not have dedicated test modes or test access so a workaround is needed to address the trimming and configuration (derivative) issue.

BRIEF SUMMARY OF THE INVENTION

It is therefore an object of this invention to provide an improved test mode control circuit for reconfiguring a device pin of an integrated circuit chip which is initially in a test mode for trimming/reconfiguring an associated circuit.

It is a further object of this invention to provide such an improved test mode control circuit for reconfiguring a device pin of an integrated circuit chip which employs a normal device pin as a test pin in the test mode and then returns it to its device pin function when the test mode trimming/reconfiguring is finished.

It is a further object of this invention to provide such an improved test mode control circuit for reconfiguring a device pin of an integrated circuit chip in which the device pin is reconfigured from test pin back to device pin functionality in response to the logic state of a separate input pin.

It is a further object of this invention to provide such an improved test mode control circuit for reconfiguring a device pin of an integrated circuit chip which enables test access for low pin count integrated circuit chip packages.

It is a further object of this invention to provide such an improved test mode control circuit for reconfiguring a device pin of an integrated circuit chip which enables in-package testing for more accurate integrated circuits such as analog to digital converters.

It is a further object of this invention to provide such an improved test mode control circuit for reconfiguring a device pin of an integrated circuit chip which enables easy reconfiguring of generic designs into a variety of standard parts.

The invention results from the realization that test access to even low pin count integrated circuit chips for trimming and reconfiguring the on board integrated circuits can be achieved by reconfiguring a device pin to function as a test pin under control of the logic state of a second pin coupled with the use of an on-chip programmable array which is preset during manufacturing to the test mode and which can be used to permanently trim and/or reconfigure components after which it can be reset to the normal mode to reestablish the normal function of the device pin.

This invention features a test mode control circuit for reconfiguring a device pin of an integrated circuit chip which is initially configured in a test mode. An input register applies trim/configuring data to one or more components on an integrated circuit chip. There is a device pin and an output register for receiving output data from an integrated circuit on the integrated circuit chip which integrated circuit has had one or more of its elements trimmed/reconfigured. An I/O logic circuit controls the device pin to operate as a test pin to selectively deliver the trim/configuring data to the input register and receive output data from the output register. A programmable array includes a plurality of logic state elements for permanently mapping a selected set of the trim/configuring data from the input register. The programmable array includes a test bit. A switching system applies the trim/configuring data to the one or more components on the integrated circuit when the test bit is in a first, test mode and applies the permanently mapped trim/configuring data to the components in a second normal mode.

In a preferred embodiment, the switching system may include a multiplexor. A logic state element may includes fuses, anti-fuses, EEPROMs, or similar devices. The test bit may be initially in the first, test mode. The I/O logic circuit may respond to the logic state of a second pin and the test bit to enable the device pin to selectively output or input data. The I/O logic circuit is responsive to the test bit being in the test mode and the second pin being in one of first and second states to configure the device pin to provide input and output data, respectively, and to the test bit being in the normal mode and the second pin being in one of first and second states to configure the device pin to provide high impedance and output data, respectively.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
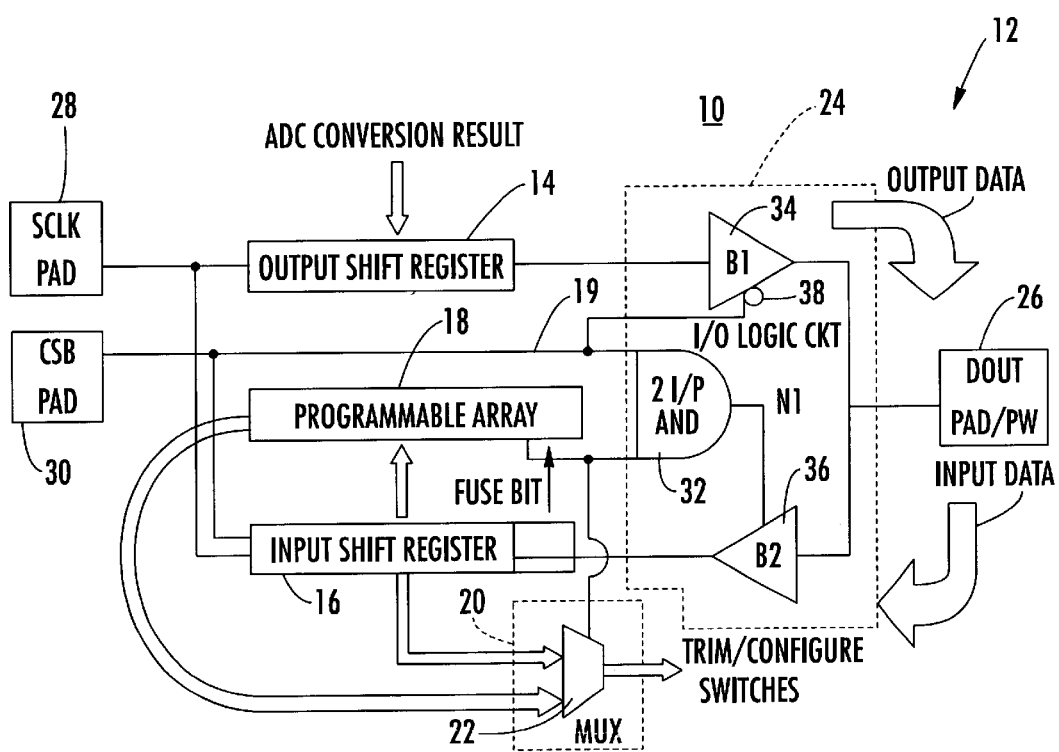
FIG. 1 is a schematic block diagram of a test mode control circuit for reconfiguring a device pin to temporarily function as a test pin according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 a test mode control circuit 10 according to this invention, contained on an integrated circuit chip 12 which typically includes a number (not shown) of other integrated circuits such as analog-to-digital converters (ADCs) and other circuits. Test mode control circuit 10 includes output shift register 14, input shift register 16, programmable array 18 with test bit stage 19, switching system 20, such as, for example, mux 22, and I/O logic circuit 24. Also present is device pin or pad 26 which for example may be a DOUT pin as shown. Device pad or pin 26, in this embodiment, in the normal mode of operation provides data output. In the test mode, in accordance with this invention, device pin 26 acts either to deliver input data or to receive output data depending upon the condition of I/O logic circuit 24. Initially, upon completion of the manufacturing of integrated circuit chip 12, test mode control circuit 10 is preset to the test mode. After the trimming and reconfiguration is accomplished in test mode, control circuit 10 is returned to the normal mode and device pin 26 operates once again in the normal mode to provide either output data or a high impedance output. Also present are clock pad or pin 28 which provides a clock signal such as SCLK to clock the data through output shift register 14 and input register 16. A second device pin 30 provides a logic signal to I/O circuit 24 such as chip select bar or CSB signal whose logic state determines whether device pin 26 is to function to receive input data or output data.

I/O logic circuit 24 in this embodiment includes AND gate 32, output buffer amplifier 34, and input buffer amplifier 36. Initially with the test bit set high in the test mode, AND gate 32 will provide a high output when the input from CSB pad 30 is high. This high output from AND gate 32 will enable buffer 36 to pass instructional input data from DOUT pin 26 to input shift register 16. The same high state of the CSB signal from pin 30 is inverted at 38 and disables output buffer 34 so that the data in output shift register 14 is not passed to device pin 26. The data in output shift register 14 comes selectively from any one of the integrated circuits on board the integrated circuit chip 12. For example in the case of an ADC the data in the output shift register 14 may be the ADC conversion result.

When the logic state of the CSB signal from pin 30 changes to low, AND gate 32 has a low output thus disabling buffer 36 so that input data can no longer be supplied to input shift register 16. The low state of the signal, however, when transformed by inverter 38 enables buffer 34 so that it now passes the data from output shift register 14 to device pin 26.

In operation, switching system 20, or mux 22 is enabled to pass the instructional input data from input shift register 16 to trimming/configure switches in the one or more integrated circuits on board chip 12. The circuit which was trimmed/configured is then operated to provide an output which it delivers to output shift register 14. This is routed through buffer 34 to device pin 26 in response to the proper logic state on the second pin 30 and is then reviewed by evaluation and test circuits (not shown or here relevant). If the output is not found accurate and acceptable, another set of data instructions will be loaded into input shift register 16 and the data instructions will be delivered by mux 22 to the trim/configure switches of the same circuit. This continues until the evaluation indicates that the output is accurate and acceptable. This may be done for one or a number of integrated circuits on integrated circuit chip 12.

When the entire operation is complete, the particular arrangement of the trim/configure switches now present in input shift register 16 are communicated to the programmable array 18, each of whose logic elements which may be a fuse, an anti-fuse, an EEPROM, or similar device is conditioned to reflect the mapping of the one or zero data instructions in input shift register 16. The mapping permanently installs those logic conditions in programmable array 18 and changes the state of the test bit stage 19 from on to off so that the system now goes into the normal mode from the test mode. In this state, with the fuse bit in stage 19 off, mux 22 has its input from input shift register 16 disabled so it now can receive only input from the logic elements of programmable array 18. And device pin 26 has been reconfigured to perform its device pin functions as opposed to its test pin functions.

As shown in the following truth table, Chart I below, when the test bit stage 19 holds a one the system is in the test mode; when it holds a zero the system is in the normal mode.

| CHART I | | |
|---|---|---|
| CSB | Test Bit | Device Pin 26 |
| 1 | 1 | Input Data |
| 0 | 1 | Output Data |
| 1 | 0 | High-Z |
| 0 | 0 | Output Data |

Thus, when the logic state of pad/pin 30, for example CSB signal, is one, device pin 26 is conditioned to receive input data. When CSB is logic state zero and test bit stage 19 still holds a one indicating test mode, device pin 26 is conditioned to receive output data. In contrast, when the test bit stage holds a zero and the system is in the normal mode, the logic state of one, at pad/pin 30 produces a high impedance output and the logic state of zero conditions the output pin device for output data. Note that regardless of the state of the test bit, whether it be one or zero, the device pin 26 is always conditioned to receive output data when the second pin 30 is at zero. Stated another way, whenever the second pin 30 is at zero device pin 26 will be conditioned to receive output data regardless of the state of the test bit.

Figure 2:
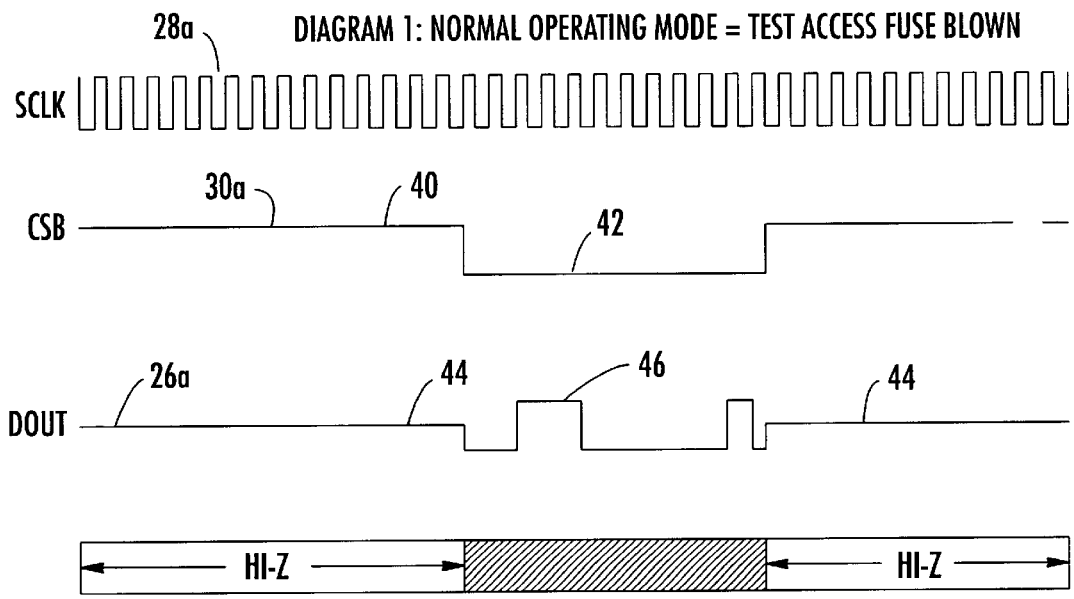
FIG. 2 shows the wave form in the SCLK, CSB, and DOUT pins of FIG. 1 in the normal mode.
Figure 3:
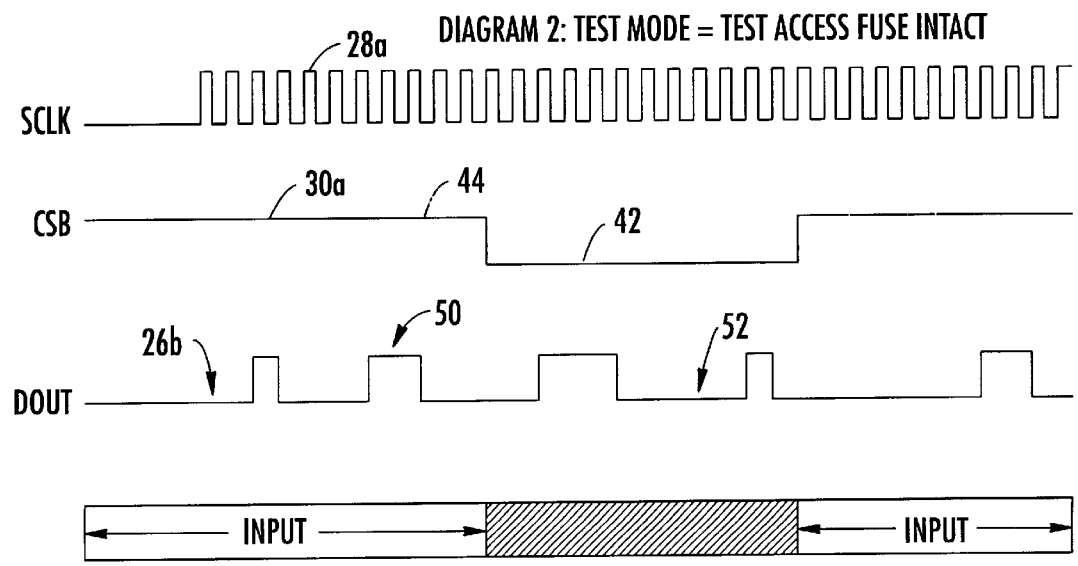
FIG. 3 shows the wave form in the SCLK, CSB, and DOUT pins of FIG. 1 in the test mode.

SCLK 28*a*, CSB 30*a*, and DOUT signals 26*a* are shown in FIG. 2. SCLK 28*a* is a conventional clock signal. CSB 30*a* has two states, a high state 40 and a low state 42. During the high state 40, the DOUT signal 26*a* is a high impedance 44 in a tri-state system. During the low state 42 of CSB 30*a* data 46 is clocked out of device pin 26. At the end of the low state 42 of CSB signal 30*a*, DOUT once again returns to the high impedance level 44. In contrast, in the test mode, FIG. 3, while SCLK 28*a* and CSB 30*a* remain the same, DOUT signal 26*b* is enabled to receive input 50 while CSB 30*a* is high and output 52 when CSB 30*a* is low.

Thus, the improved test mode control circuit of this invention reconfigures a device pin of an integrated circuit chip which is initially in the test mode in order to trim/configure an integrated circuit or circuits on board the integrated circuit chip. The system uses the second pin logic state, for example the CSB signal logic state, to control the function of the device pin as a test pin in the test mode thereby conserving pin use and space, yet enabling more accurate testing and even reconfiguring of generic designs into a variety of standard parts.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A test mode control circuit for reconfiguring a device pin of an integrated circuit chip which is initially configured in a test mode comprising:

an input register for applying trim/configuring data to one or more components on an integrated circuit chip;

a device pin;

an output register for receiving output data from an integrated circuit on said integrated circuit chip which integrated circuit has had one or more of its elements trimmed/reconfigured;

an I/O logic circuit for controlling said device pin to operate as a test pin to selectively deliver said trim/configuring data to said input register and receive output data from said output register;

a programmable array including plurality of logic state elements for permanently mapping a selected set of said trim/configuring data from said input register, said programmable array including a test bit; and a switching system for applying said trim/configuring data to said one or more components on said integrated circuit when said test bit is in a first, test mode and for applying said permanently mapped trim/configuring data to said components in a second, normal mode.

2. The test mode control circuit of claim 1 in which said switching system includes a multiplexor.

3. The test mode control circuit of claim 1 in which said logic state elements include fuses.

4. The test mode control circuit of claim 1 in which said logic state elements include anti-fuses.

5. The test mode control circuit of claim 1 in which said logic state elements include an EEPROM.

6. The test mode control circuit of claim 1 in which said test bit is initially set to said first, test mode.

7. The test mode control circuit of claim 1 in which said I/O logic circuit responds to the logic state of a second pin and said test bit to enable said device pin to selectively output and input data.

8. The test mode control circuit of claim 7 in which said I/O circuit is responsive to the test bit being set to the test mode and said second pin being in one of first and second states to configure said device pin to provide input and output data, respectively, and to said test bit being set to the normal mode and said second pin being in one of first and second states to configure said device pin to provide high impedance and output data, respectively.

* * * * *